United States Patent
Lee

(10) Patent No.: US 10,475,486 B2
(45) Date of Patent: Nov. 12, 2019

(54) ELECTRONIC DEVICES

(71) Applicant: SK hynix Inc., Icheon-si, Gyeonggi-do (KR)

(72) Inventor: Yo Sep Lee, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/870,566

(22) Filed: Jan. 12, 2018

(65) Prior Publication Data

US 2019/0027198 A1     Jan. 24, 2019

(30) Foreign Application Priority Data

Jul. 20, 2017   (KR) .......................... 10-2017-0091932

(51) Int. Cl.
| | |
|---|---|
| *G11C 7/00* | (2006.01) |
| *G11C 7/10* | (2006.01) |
| *G11C 11/4096* | (2006.01) |
| *G11C 7/12* | (2006.01) |
| *G11C 7/22* | (2006.01) |

(52) U.S. Cl.
CPC ............ *G11C 7/1006* (2013.01); *G11C 7/109* (2013.01); *G11C 7/1045* (2013.01); *G11C 7/1066* (2013.01); *G11C 7/1069* (2013.01); *G11C 7/1093* (2013.01); *G11C 7/12* (2013.01); *G11C 7/222* (2013.01); *G11C 11/4096* (2013.01); *G11C 2207/105* (2013.01); *G11C 2207/108* (2013.01)

(58) Field of Classification Search
CPC ... G11C 7/1006; G11C 7/1045; G11C 7/1066; G11C 7/1069; G11C 7/109; G11C 7/12; G11C 7/222; G11C 11/4096

USPC .............................. 365/203, 193, 189.08, 191
See application file for complete search history.

(56) References Cited

U.S. PATENT DOCUMENTS

| | | | | |
|---|---|---|---|---|
| 7,032,143 | B1 * | 4/2006 | Waller | G11C 7/1051 |
| | | | | 365/201 |
| 7,298,655 | B2 * | 11/2007 | Choi | G11C 11/4091 |
| | | | | 365/189.011 |
| 9,280,454 | B1 | 3/2016 | Elsasser et al. | |
| 9,330,741 | B2 * | 5/2016 | Song | G11C 7/1093 |
| 9,390,815 | B1 * | 7/2016 | Hyun | G11C 29/1201 |
| 9,928,895 | B2 * | 3/2018 | Loh | G11C 11/40611 |
| 9,941,020 | B2 * | 4/2018 | Hyun | G11C 29/022 |
| 9,983,025 | B2 * | 5/2018 | Zuta | G01P 3/487 |

(Continued)

FOREIGN PATENT DOCUMENTS

KR      1020160107685 A      9/2016

*Primary Examiner* — Viet Q Nguyen
(74) *Attorney, Agent, or Firm* — William Park & Associates Ltd.

(57) ABSTRACT

An electronic device includes a pulse generator, a signal synthesizer, and a first storage circuit. The pulse generator generates a mode active pulse and a mode pre-charge pulse in response to an operation mode signal. The signal synthesizer synthesizes an active signal and the mode active pulse to generate a synthesized active signal. The signal synthesizer synthesizes a pre-charge signal and the mode pre-charge pulse to generate a synthesized pre-charge signal. The first storage circuit performs an active operation, a read operation, or a pre-charge operation in response to the synthesized active signal, a read signal, and the synthesized pre-charge signal in each of a first read mode and a second read mode.

18 Claims, 10 Drawing Sheets

(56) References Cited

U.S. PATENT DOCUMENTS

| | | | |
|---|---|---|---|
| 10,002,651 B2* | 6/2018 | Choi | G11C 7/106 |
| 10,026,463 B1* | 7/2018 | Kwak | G11C 7/222 |
| 10,037,811 B1* | 7/2018 | Kim | G11C 16/08 |
| 2008/0080267 A1* | 4/2008 | Lee | G11C 7/1051 |
| | | | 365/191 |
| 2011/0175654 A1* | 7/2011 | Lee | G11C 7/1051 |
| | | | 327/158 |
| 2012/0026809 A1* | 2/2012 | Yang | G11C 29/28 |
| | | | 365/189.15 |
| 2013/0061102 A1* | 3/2013 | Sohn | G11C 7/1006 |
| | | | 714/718 |
| 2014/0177377 A1* | 6/2014 | Kumar | G11C 29/022 |
| | | | 365/233.12 |
| 2016/0034340 A1* | 2/2016 | Dono | G06F 11/1016 |
| | | | 714/758 |
| 2016/0155490 A1* | 6/2016 | Shin | G11C 11/4085 |
| | | | 365/203 |
| 2016/0300626 A1* | 10/2016 | Hyun | G11C 29/022 |
| 2017/0221546 A1* | 8/2017 | Loh | G11C 11/40611 |
| 2018/0061474 A1* | 3/2018 | Choi | G06F 3/0619 |

\* cited by examiner

ELECTRONIC DEVICES

CROSS-REFERENCE TO RELATED APPLICATIONS

The present application claims priority under 35 U.S.C 119(a) to Korean Application No. 10-2017-0091932, filed on Jul. 20, 2017, which is incorporated herein by references in its entirety.

BACKGROUND

1. Technical Field

Embodiments of the present disclosure relate to electronic devices including storage circuits.

2. Related Art

Each electronic device may include storage circuits for storing various kinds of data. Each of the storage circuits may store not only commands and addresses but also control signals for controlling various operations.

SUMMARY

According to an embodiment, an electronic device includes a pulse generator, a signal synthesizer, and a first storage circuit. The pulse generator generates a mode active pulse and a mode pre-charge pulse in response to an operation mode signal. The signal synthesizer synthesizes an active signal and the mode active pulse to generate a synthesized active signal. The signal synthesizer synthesizes a pre-charge signal and the mode pre-charge pulse to generate a synthesized pre-charge signal. The first storage circuit performs an active operation, a read operation, or a pre-charge operation in response to the synthesized active signal, a read signal, and the synthesized pre-charge signal in each of a first read mode and a second read mode.

According to another embodiment, an electronic device includes a first storage circuit, a second storage circuit, and a selection/output circuit. The first storage circuit outputs first data stored therein to a first input/output (I/O) line in response to a synthesized active signal and a read signal in each of a first read mode and a second read mode. The second storage circuit outputs second data stored therein to a second I/O line in response to the read signal and an operation mode signal in the second read mode. The selection/output circuit outputs data loaded on the first or second I/O line in response to the read signal and the operation mode signal.

According to yet another embodiment, an electronic device includes a first storage circuit, a second storage circuit and a selection/output circuit. The first storage circuit outputs first data stored therein to a first input/output (I/O) line in response to a read signal in each of a first read mode and a second read mode. The second storage circuit outputs second data stored therein to a second I/O line in response to the read signal and an operation mode signal in the second read mode. The selection/output circuit outputs data loaded on the first or second I/O line in response to the read signal and the operation mode signal.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
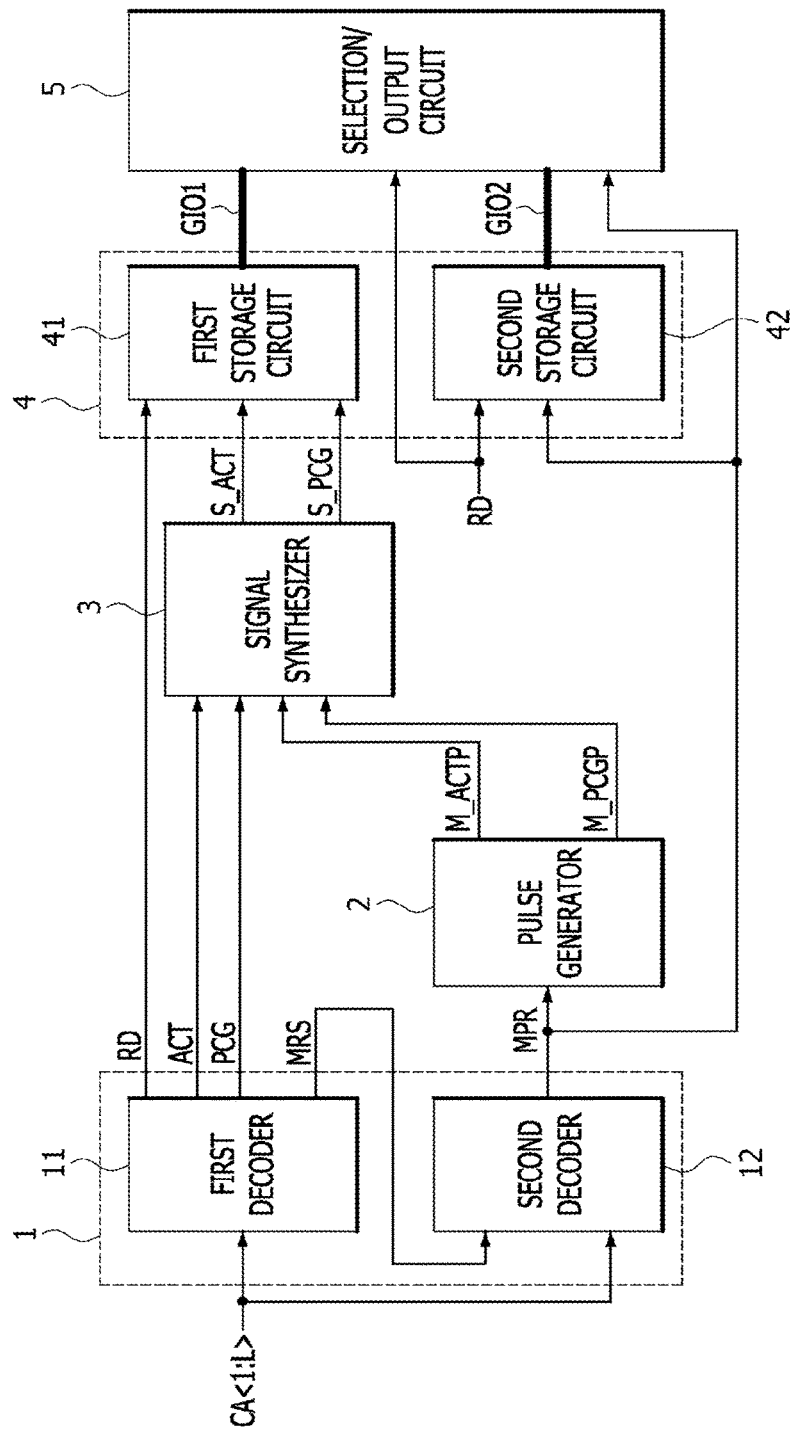
FIG. 1 is a block diagram illustrating a configuration of an electronic device according to an embodiment of the present disclosure.

As illustrated in FIG. 1, an electronic device according to an embodiment may include a decoder group 1, a pulse generator 2, a signal synthesizer 3, a storage circuit group 4, and a selection/output circuit 5. The decoder group 1 may include a first decoder 11 and a second decoder 12. The storage circuit group 4 may include a first storage circuit 41 and a second storage circuit 42.

The first decoder 11 may generate a read signal RD, an active signal ACT, a pre-charge signal PCG, and a mode register set signal MRS in response to a control signal CA<1:L>. The control signal CA<1:L> may include at least one of a command and an address which are provided by an external device. The number "L" of bits included in the control signal CA<1:L> may be set to be different according to the embodiment. The read signal RD may be enabled in a multi-purpose read mode and in a normal read mode. The multi-purpose read mode may correspond to an operation mode for performing a read operation that outputs data stored in a register (422 of FIG. 6) for storing information on a plurality of modes. The normal read mode may correspond to an operation mode for performing a read operation that outputs data stored in a cell array (410 of FIG. 5). The active signal ACT may be enabled to perform an active operation that selectively activates any one of a plurality of word lines which are connected to the cell array (410 of FIG. 5) in the normal read mode. The pre-charge signal PCG may be enabled to perform a pre-charge operation in the normal read mode. The mode register set signal MRS may be enabled to perform a mode register set operation for setting information that is necessary for execution of various operation modes of the electronic device. The first decoder 11 may decode the control signal CA<1:L> to generate the read signal RD, the active signal ACT, the pre-charge signal PCG, and the mode register set signal MRS, one of which is selectively enabled. A logic level of each of the read signal RD, the active signal ACT, the pre-charge signal PCG, and the mode register set signal MRS, which are enabled, may be set to be different according to the embodiment.

The second decoder 12 may generate an operation mode signal MPR in response to the mode register set signal MRS and the control signal CA<1:L>. The second decoder 12 may generate the operation mode signal MPR after the mode register set operation is performed, where the operation mode signal MPR is enabled if the control signal CA<1:L> has a predetermined level combination. A logic level combination of the control signal CA<1:L> for enabling the mode register set signal MRS may be set to be different according to the embodiment. The second decoder 12 may generate the operation mode signal MPR which is enabled to enter the multi-purpose read mode.

The pulse generator 2 may generate a mode active pulse M_ACTP and a mode pre-charge pulse M_PCGP in response to the operation mode signal MPR. The pulse generator 2 may generate the mode active pulse M_ACTP which is created in synchronization with a time that the operation mode signal MPR is enabled. The pulse generator 2 may generate the mode pre-charge pulse M_PCGP which is created in synchronization with a time that the operation mode signal MPR is disabled. In some embodiments, the mode active pulse M_ACTP may be created after a predetermined delay time elapses from a time that the operation mode signal MPR is enabled, and the mode pre-charge pulse M_PCGP may be created after a predetermined delay time elapses from a time that the operation mode signal MPR is disabled.

The signal synthesizer 3 may generate a synthesized active signal S_ACT and a synthesized pre-charge signal S_PCG from the active signal ACT, the pre-charge signal PCG, the mode active pulse M_ACTP, and the mode pre-charge pulse M_PCGP. The signal synthesizer 3 may synthesize the active signal ACT and the mode active pulse M_ACTP to generate the synthesized active signal S_ACT. The signal synthesizer 3 may generate the synthesized active signal S_ACT which is enabled if active signal ACT is enabled or the mode active pulse M_ACTP is received. The signal synthesizer 3 may synthesize the pre-charge signal PCG and the mode pre-charge pulse M_PCGP to generate synthesized pre-charge signal S_PCG. The signal synthesizer 3 may generate the synthesized pre-charge signal S_PCG which is enabled if the pre-charge signal PCG is enabled or the mode pre-charge pulse M_PCGP is received.

The first storage circuit 41 may include the cell array (410 of FIG. 5) storing data. The first storage circuit 41 may perform the active operation, the read operation, or the pre-charge operation in response to the synthesized active signal S_ACT, the read signal RD, and the synthesized pre-charge signal S_PCG in each of the normal read mode and the multi-purpose read mode. The first storage circuit 41 may output data stored therein to a first global input/output (I/O) line GIO1 in response to the synthesized active signal S_ACT and the read signal RD in each of the normal read mode and the multi-purpose read mode. The first storage circuit 41 may perform the active operation that selectively enables any one of the word lines connected to the cell array (410 of FIG. 5) if the synthesized active signal S_ACT is enabled. The first storage circuit 41 may perform the read operation that outputs data stored in the cell array to the first global I/O line GIO1 if the read signal RD is enabled. That is, data stored in the cell array (410 of FIG. 5) of the first storage circuit 41 may be outputted to the first global I/O line GIO1 in the normal read mode. The first storage circuit 41 may perform the pre-charge operation if the synthesized pre-charge signal S_PCG is enabled. In one example, the first storage circuit 41 may perform the pre-charge operation in response to a synthesized pre-charge signal S_PCG in each of the normal read mode and the multi-purpose read mode.

The second storage circuit 42 may be realized using a register (not shown) that stores information about various operation modes. The second storage circuit 42 may enter the multi-purpose read mode in response to the read signal RD and the operation mode signal MPR. The second storage circuit 42 may output data stored therein to a second global I/O line GIO2 if both of the read signal RD and the operation mode signal MPR are enabled to put the second storage circuit 42 in the multi-purpose read mode.

The selection/output circuit 5 may select and output data loaded on any one of the first and second global I/O lines GIO1 and GIO2 in response to the read signal RD and the operation mode signal MPR. The selection/output circuit 5 may output the data loaded on the first global I/O line GIO1 if the read signal RD is enabled to perform the read operation. The selection/output circuit 5 may output the data loaded on the second global I/O line GIO2 if both the read signal RD and the operation mode signal MPR are enabled to put the second storage circuit 42 in the multi-purpose read mode.

Figure 2:
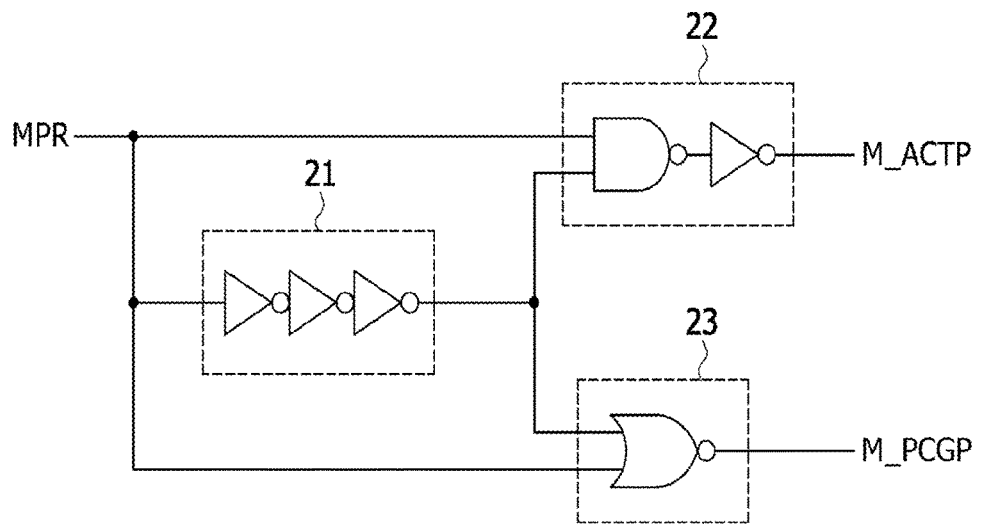
FIG. 2 is a circuit diagram illustrating an example of a pulse generator included in the electronic device of FIG. 1.

Referring to FIG. 2, the pulse generator 2 may include an inversion/delay circuit 21, a first pulse output circuit 22, and a second pulse output circuit 23. The inversion/delay circuit 21 may be realized using an odd number of inverters which are connected in series. The inversion/delay circuit 21 may inversely delay the operation mode signal MPR and may output the inversely delayed operation mode signal MPR. The first pulse output circuit 22 may perform an AND operation on the operation mode signal MPR and an output signal of the inversion/delay circuit 21 to generate the mode active pulse M_ACTP. The second pulse output circuit 23 may perform a NOR operation on the operation mode signal MPR and an output signal of the inversion/delay circuit 21 to generate the mode pre-charge pulse M_PCGP.

Figure 3:
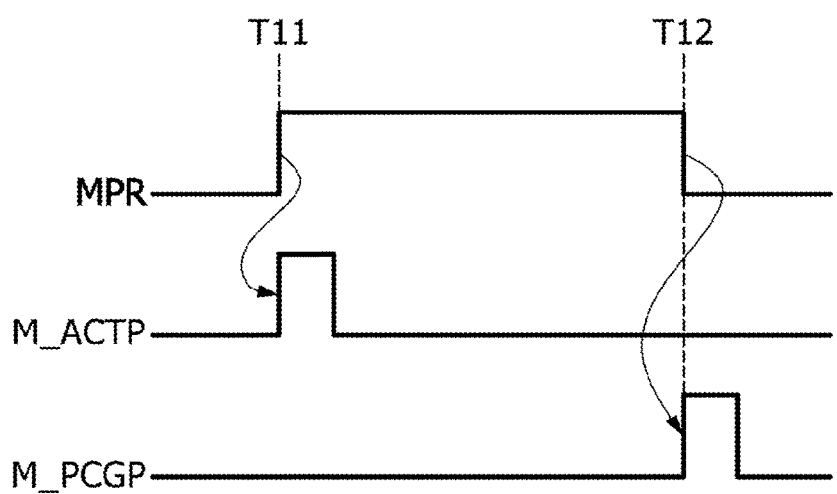
FIG. 3 is a timing diagram illustrating an operation of the pulse generator shown in FIG. 2.

Referring to FIG. 3, the mode active pulse M_ACTP may be generated in synchronization with a time "T11" that the operation mode signal MPR is enabled to have a logic "high" level, and the mode pre-charge pulse M_PCGP may be generated in synchronization with a time "T12" that the operation mode signal MPR is disabled to have a logic "low" level. The mode active pulse M_ACTP may be generated when the multi-purpose read mode starts, and the mode pre-charge pulse M_PCGP may be generated when the multi-purpose read mode terminates.

Figure 4:
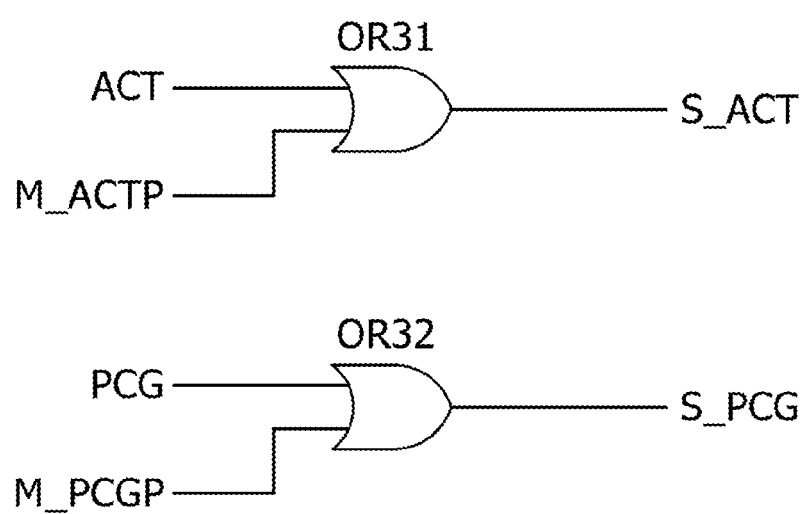
FIG. 4 is a circuit diagram illustrating an example of a signal synthesizer included in the electronic device of FIG. 1.

Referring to FIG. 4, the signal synthesizer 3 may include OR gates OR31 and OR32. The OR gate OR31 may receive the active signal ACT and the mode active pulse M_ACTP and may perform an OR operation on the active signal ACT and the mode active pulse M_ACTP to generate the synthesized active signal S_ACT. The synthesized active signal S_ACT may be enabled to have a logic "high" level if the active signal ACT is enabled to have a logic "high" level or the mode active pulse M_ACTP is has a logic "high" level. The OR gate OR32 may receive the pre-charge signal PCG and the mode pre-charge pulse M_PCGP and may perform an OR operation on the pre-charge signal PCG and the mode pre-charge pulse M_PCGP to generate the synthesized pre-charge signal S_PCG. The synthesized pre-charge signal S_PCG may be enabled to have a logic "high" level if the pre-charge signal PCG is enabled to have a logic "high" level or the mode pre-charge pulse M_PCGP has a logic "high" level.

Figure 5:
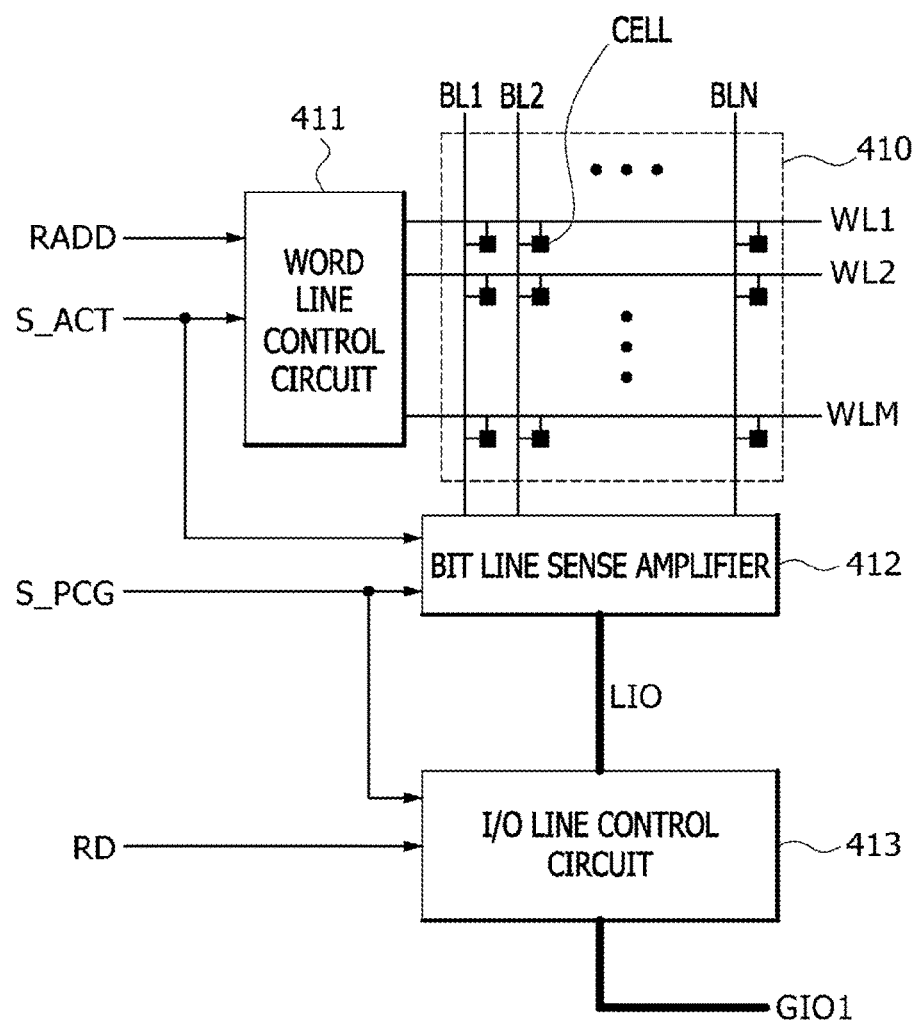
FIG. 5 is a block diagram illustrating an example of a first storage circuit included in the electronic device of FIG. 1.

Referring to FIG. 5, the first storage circuit 41 may include the cell array 410, a word line control circuit 411, a bit line sense amplifier 412, and an I/O line control circuit 413. The first storage circuit 41 may perform the active operation, the read operation, and the pre-charge operation in each of the normal read mode and the multi-purpose read mode.

The cell array 410 may include a plurality of cells, each of which is connected to any one of first to $M^{th}$ word lines WL1~WLM and any one of first to $N^{th}$ bit lines BL1~BLN. The cell array 410 may load the data stored in the cells, which are connected to any one selected from the first to $M^{th}$ word lines WL1~WLM, onto the first to $N^{th}$ bit lines BL1~BLN.

The word line control circuit 411 may perform the active operation in response to the synthesized active signal S_ACT. The word line control circuit 411 may selectively activate any one of the first to $M^{th}$ word lines WL1~WLM if the synthesized active signal S_ACT is enabled. The activated word line among the first to $M^{th}$ word lines WL1~WLM may be determined by a row address RADD.

The bit line sense amplifier 412 may sense and amplify data loaded on the first to $N^{th}$ bit lines BL1~BLN in response to the synthesized active signal S_ACT. The bit line sense amplifier 412 may output the amplified data to a local I/O line LIO after the data loaded on the first to $N^{th}$ bit lines BL1~BLN are sensed and amplified if the active operation is performed by the synthesized active signal S_ACT which is enabled. The bit line sense amplifier 412 may perform the pre-charge operation in response to the synthesized pre-charge signal S_PCG. The bit line sense amplifier 412 may drive the first to $N^{th}$ bit lines BL1~BLN to have a pre-charge voltage (not shown) if the synthesized pre-charge signal S_PCG is enabled.

The I/O line control circuit 413 may drive the first global I/O line GIO1 in response to the read signal RD according to the data loaded on the local I/O line LIO. The I/O line control circuit 413 may amplify the data loaded on the local I/O line LIO to output the amplified data to the first global I/O line GIO1 if the read signal RD is enabled.

Figure 6:
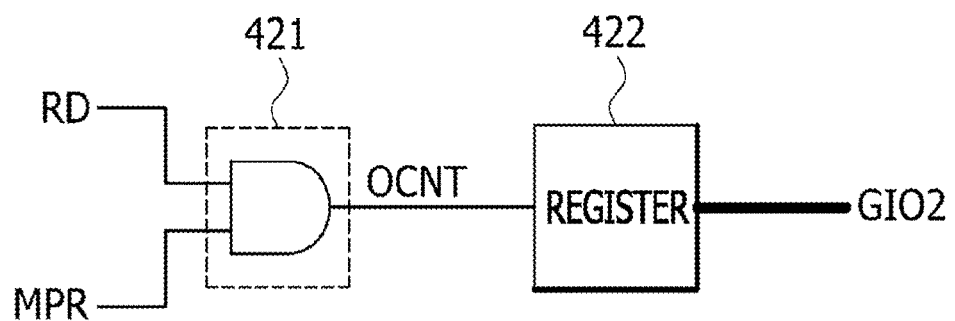
FIG. 6 is a block diagram illustrating an example of a second storage circuit included in the electronic device of FIG. 1.

Referring to FIG. 6, the second storage circuit 42 may include an output control signal generation circuit 421 and a register 422. The output control signal generation circuit 421 may generate an output control signal OCNT in response to the read signal RD and the operation mode signal MPR. The output control signal generation circuit 421 may generate the output control signal OCNT which is enabled to have a logic "high" level if both of the read signal RD and the operation mode signal MPR are enabled to have a logic "high" level in the multi-purpose read mode. The register 422 may include information about various operation modes using a mode register set. The register 422 may drive the second global I/O line GIO2 in response to the output control signal OCNT. The register 422 may output the information stored therein through the second global I/O line GIO2 if the output control signal OCNT is enabled.

Figure 7:
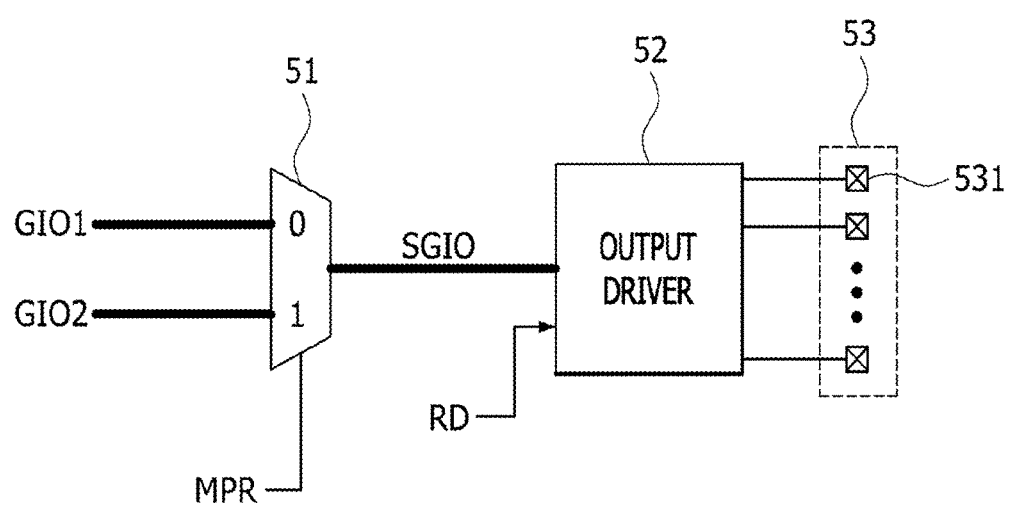
FIG. 7 is a block diagram illustrating an example of a selection/output circuit included in the electronic device of FIG. 1.

Referring to FIG. 7, the selection/output circuit 5 may include a selector 51, an output driver 52, and an output pad group 53.

The selector 51 may output data loaded on any one of the first and second global I/O lines GIO1 and GIO2 to a selection I/O line SGIO in response to the operation mode signal MPR. The selector 51 may output the data on the first global I/O line GIO1 in the normal read mode to the selection I/O line SGIO. The selector 51 may output the data on the second global I/O line GIO2 to the selection I/O line SGIO in the multi-purpose read mode.

The output driver 52 may output the data loaded on the selection I/O line SGIO to the output pad group 53 in response to the read signal RD. The output driver 52 may perform the read operation in response to the read signal RD which is enabled in the normal read mode and the multi-purpose read mode. The output driver 52 may output the data loaded on the selection I/O line SGIO to the output pad group 53 including a plurality of pads during the read operation. Accordingly, data loaded on the first global I/O line GIO1 may be outputted through a pad 531, for example, of the output pad group 53 if the read signal RD is enabled in the normal read mode. Further, data loaded on the second global I/O line G1O2 may be outputted through a pad 531, for example, if the read signal and the operation mode signal MPR are enabled in the multi-purpose read mode.

Figure 8:
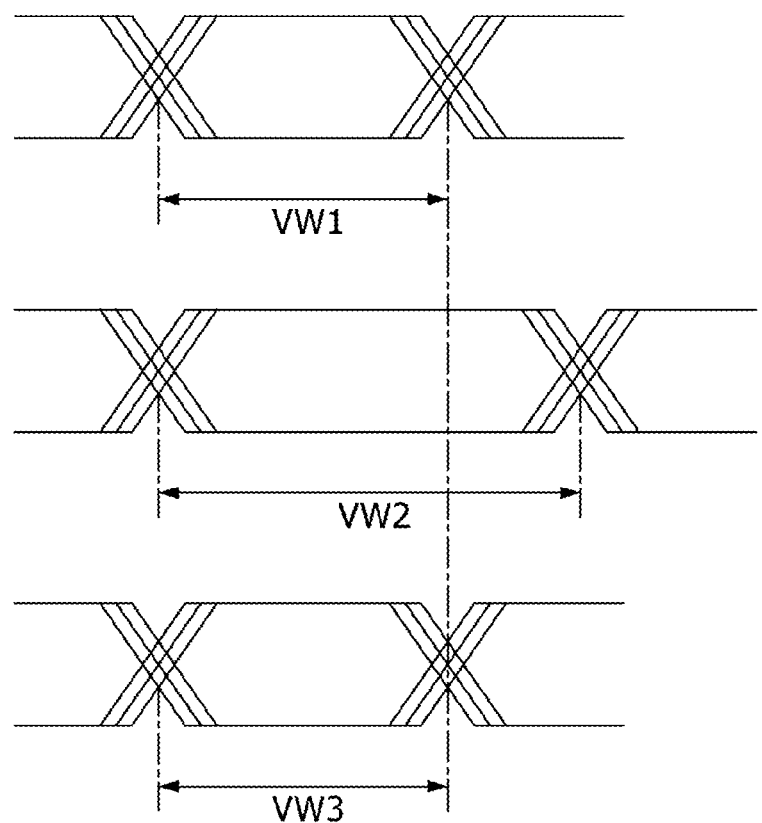
FIG. 8 illustrates effective windows of data outputted from the electronic device shown in FIG. 1.

As described above, the electronic device according to the above embodiment may perform the active operation, the read operation, and the pre-charge operation in each of the normal read mode and the multi-purpose read mode. FIG. 8 illustrates an effective window VW1 of data outputted in the normal read mode and effective windows VW2 and VW3 of data outputted in the multi-purpose read mode. Referring to FIG. 8, a width of the effective window VW3 when the active operation, the read operation, or the pre-charge operation are performed in the multi-purpose read mode may be narrower than a width of the effective window VW2 when the active operation, the read operation or the pre-charge operation are not performed in the multi-purpose read mode. That is, the electronic device according to the above embodiment may reduce a difference between the effective window of the output data in the normal read mode and the effective window of the output data in the multi-purpose read mode.

Figure 9:
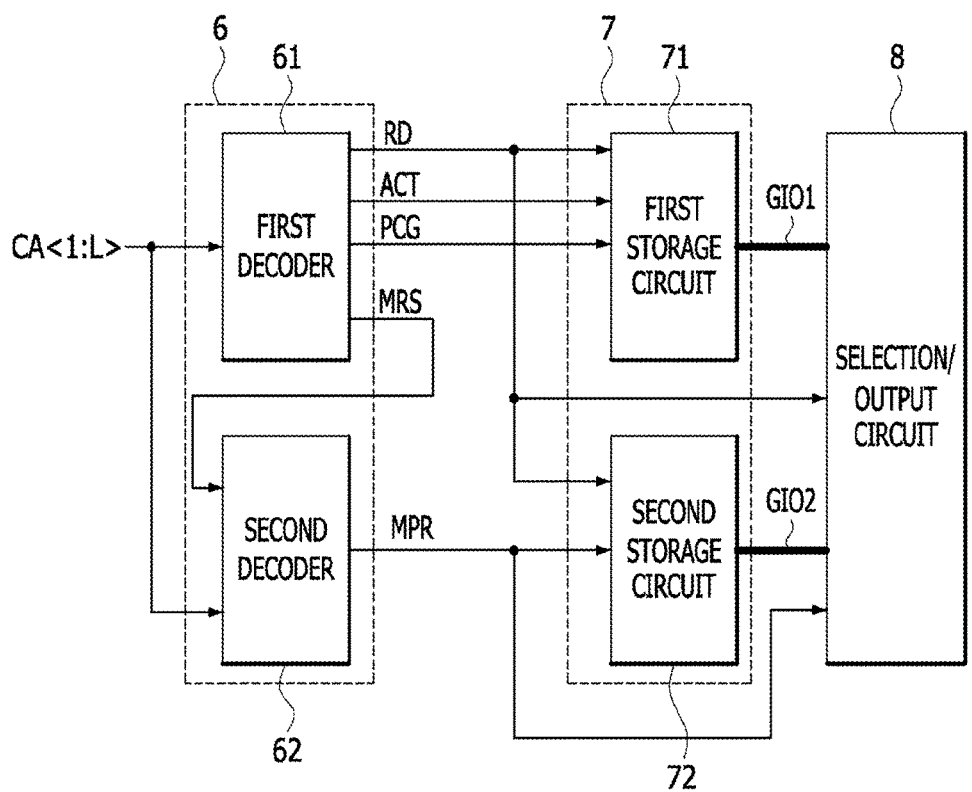
FIG. 9 is a block diagram illustrating a configuration of an electronic device according to another embodiment of the present disclosure.

As illustrated in FIG. 9, an electronic device according to another embodiment may include a decoder group 6, a storage circuit group 7, and a selection/output circuit 8. The decoder group 6 may include a first decoder 61 and a second decoder 62. The storage circuit group 7 may include a first storage circuit 71 and a second storage circuit 72.

The first decoder 61 may generate a read signal RD, an active signal ACT, a pre-charge signal PCG, and a mode register set signal MRS in response to a control signal CA<1:L>. The control signal CA<1:L> may include at least one of a command and an address which are provided by an external device. The number "L" of bits included in the control signal CA<1:L> may be set to be different according to the embodiment. The read signal RD may be enabled to perform a read operation for outputting data stored in a cell array (not shown) of the first storage circuit 71 in a multi-purpose read mode or in a normal read mode. The active signal ACT may be enabled to perform an active operation that selectively activates any one of the word lines which are connected to the cell array in the normal read mode. The pre-charge signal PCG may be enabled to perform a pre-charge operation in the normal read mode. The mode register set signal MRS may be enabled to perform a mode register set operation for setting information that is necessary for execution of various operation modes of the electronic device. The first decoder 61 may decode the control signal CA<1:L> to generate the read signal RD, the active signal ACT, the pre-charge signal PCG, and the mode register set signal MRS, one of which is selectively enabled. A logic level of each of the read signal RD, the active signal ACT, the pre-charge signal PCG, and the mode register set signal MRS, one of which may be enabled, may be set to be different according to the embodiment.

The second decoder 62 may generate an operation mode signal MPR in response to the mode register set signal MRS and the control signal CA<1:L>. The second decoder 62 may generate the operation mode signal MPR after the mode register set operation is performed, where the operation mode signal MPR is enabled if the control signal CA<1:L> has a predetermined level combination. A logic level combination of the control signal CA<1:L> for enabling the mode register set signal MRS may be set to be different according to the embodiment. The second decoder 62 may generate the operation mode signal MPR which is enabled to enter the multi-purpose read mode.

The first storage circuit 71 may include the cell array which stores data. The first storage circuit 71 may perform the active operation, the read operation, or the pre-charge operation in response to the active signal ACT, the read signal RD, and the pre-charge signal PCG. The first storage circuit 71 may perform the active operation if the active signal ACT is enabled where the first storage circuit 71 selectively enables any one of the word lines connected to the cell array during the active operation. The first storage circuit 71 may perform the read operation if the read signal RD is enabled, where the first storage circuit 71 outputs data stored in the cell array to a first global input/output (I/O) line GIO1 during the read operation. The first storage circuit 71 may perform the pre-charge operation if the pre-charge signal PCG is enabled. Accordingly, the first storage circuit 71 may output data stored therein to the first global I/O line GIO1 in response to the read signal in each of the normal read mode and the multi-purpose read mode.

The second storage circuit 72 may be realized using a register (not shown) that stores information about various operation modes. The second storage circuit 72 may enter the multi-purpose read mode in response to the read signal RD and the operation mode signal MPR. The second storage circuit 72 may output data stored therein to a second global I/O line GIO2 if both the read signal RD and the operation mode signal MPR are enabled to put the second storage circuit 72 in the multi-purpose read mode.

The selection/output circuit 8 may select and output data loaded on any one of the first and second global I/O lines GIO1 and GIO2 in response to the read signal RD and the operation mode signal MPR. The selection/output circuit 8 may output data loaded on the first global I/O line GIO1 to perform the read operation if the read signal RD is enabled. The selection/output circuit 8 may output data loaded on the second global I/O line GIO2 if both of the read signal RD and the operation mode signal MPR are enabled to put the second storage circuit 72 in the multi-purpose read mode.

As described above, the electronic device according to the above embodiment may perform the read operation in each of the normal read mode, and the multi-purpose read mode. Thus, the electronic device according to the above embodiment may reduce a difference between the effective window of the output data in the normal read mode and the effective window of the output data in the multi-purpose read mode.

Figure 10:
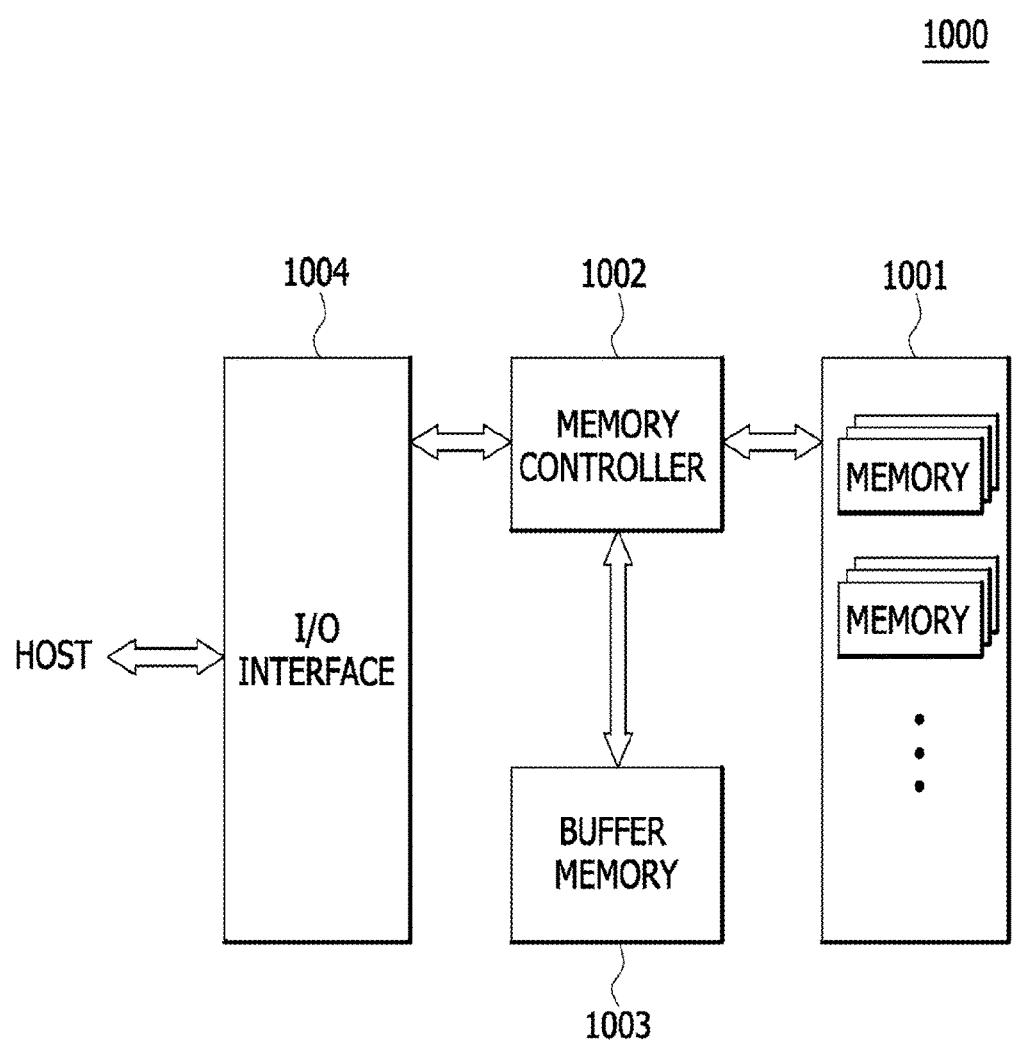
FIG. 10 is a block diagram illustrating a configuration of an electronic system employing at least one of the electronic devices described with reference to FIGS. 1 to 9.

At least one of the electronic devices described with reference to FIGS. 1 to 9 may be applied to an electronic system that includes a memory system, a graphic system, a computing system, a mobile system, or the like. For example, as illustrated in FIG. 10, an electronic system 1000 according to an embodiment may include a data storage circuit 1001, a memory controller 1002, a buffer memory 1003, and an input/output (I/O) interface 1004.

The data storage circuit 1001 may store data which is outputted from the memory controller 1002 or may read and output the stored data to the memory controller 1002, according to a control signal generated by the memory controller 1002. The data storage circuit 1001 may include at least one of the electronic devices illustrated in FIGS. 1 and 9. Meanwhile, the data storage circuit 1001 may include a nonvolatile memory that can retain stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003, or for outputting the data stored in the data storage circuit 1001 or the buffer memory 1003. Although FIG. 10 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store data to be processed by the memory controller 1002. That is, the buffer memory 1003 may temporarily store data which is outputted from or inputted to the data storage circuit 1001. The buffer memory 1003 may store data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output data generated by the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI), and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. An electronic device comprising:
a pulse generator configured to generate a mode active pulse and a mode pre-charge pulse in response to an operation mode signal;
a signal synthesizer configured to synthesize an active signal and the mode active pulse to generate a synthesized active signal and configured to synthesize a pre-charge signal and the mode pre-charge pulse to generate a synthesized pre-charge signal; and
a first storage circuit configured to include a cell array and configured to perform an active operation, a read operation or a pre-charge operation in response to the synthesized active signal, a read signal and the synthesized pre-charge signal in each of a first read mode and a second read mode.

2. The electronic device of claim 1, wherein the active signal and the pre-charge signal are enabled in the first read mode.

3. The electronic device of claim 1, wherein the operation mode signal is enabled in the second read mode.

4. The electronic device of claim 1,
wherein the mode active pulse is created in synchronization with a point of time that the operation mode signal is enabled; and
wherein the mode pre-charge pulse is created in synchronization with a point of time that the operation mode signal is disabled.

5. The electronic device of claim 1, wherein the synthesized active signal is enabled if the active signal is enabled or the mode active pulse is created.

6. The electronic device of claim 1, wherein the synthesized pre-charge signal is enabled if the pre-charge signal is enabled or the mode pre-charge pulse is created.

7. The electronic device of claim 1, wherein data stored in the cell array of the first storage circuit are outputted to a first input/output (I/O) line in the first read mode.

8. The electronic device of claim 1, further comprising a second storage circuit configured to operate in the second read mode,
wherein data stored in the second storage circuit are outputted to a second I/O line in the second read mode.

9. The electronic device of claim 8, wherein the second storage circuit is realized using a register that stores information on various operation modes.

10. The electronic device of claim 8, further comprising a selection/output circuit configured to output data loaded on the first or second I/O line in response to the read signal and the operation mode signal.

11. The electronic device of claim 10,
wherein data loaded on the first I/O line are outputted through a data pad if the read signal is enabled in the first read mode; and
wherein data loaded on the second I/O line are outputted through the data pad if the read signal and the operation mode signal are enabled in the second read mode.

12. An electronic device comprising:
a first storage circuit configured to output first data stored therein to a first input/output (I/O) line in response to a synthesized active signal and a read signal in each of a first read mode and a second read mode;
a second storage circuit configured to output second data stored therein to a second I/O line in response to the read signal and an operation mode signal in the second read mode; and
a selection/output circuit configured to output data loaded on the first or second I/O line in response to the read signal and the operation mode signal,
wherein the synthesized active signal is enabled if an active signal is enabled or a mode active pulse is created, and wherein the mode active pulse is created in synchronization with a time that the operation mode signal is enabled.

13. The electronic device of claim 12, wherein the first storage circuit performs a pre-charge operation in response to a synthesized pre-charge signal in each of the first read mode and the second read mode.

14. The electronic device of claim 13,
wherein the synthesized pre-charge signal is enabled if a pre-charge signal is enabled or a mode pre-charge pulse is created; and
wherein the mode pre-charge pulse is created in synchronization with a point of time that the operation mode signal is disabled.

15. The electronic device of claim 14,
wherein an active signal and the pre-charge signal are enabled in the first read mode; and
wherein the operation mode signal is enabled in the second read mode.

16. The electronic device of claim 12, wherein the second storage circuit is realized using a register that stores information on various operation modes.

17. An electronic device comprising:
a first storage circuit configured to output first data stored therein to a first input/output (I/O) line in response to a read signal in each of a first read mode and a second read mode;
a second storage circuit configured to output second data stored therein to a second I/O line in response to the read signal and an operation mode signal in the second read mode; and
a selection/output circuit configured to output data loaded on the first or second I/O line in response to the read signal and the operation mode signal,
wherein data loaded on the first I/O line are outputted through a data pad if the read signal is enabled in the first read mode, and wherein data loaded on the second I/O line are outputted through the data pad if the read signal and the operation mode signal are enabled in the second read mode.

18. The electronic device of claim 17,
wherein the read signal is enabled in the first read mode; and
wherein the read signal and the operation mode signal are enabled in the second read mode.

* * * * *